United States Patent
Kim et al.

(10) Patent No.: US 12,072,370 B2
(45) Date of Patent: Aug. 27, 2024

(54) SEMICONDUCTOR PACKAGE TEST APPARATUS AND METHOD

(71) Applicant: Samsung Electronics Co., Ltd., Suwon-si (KR)

(72) Inventors: Sung Ok Kim, Asan-si (KR); Min Woo Kim, Cheonan-si (KR); Ho Gyung Kim, Cheonan-si (KR); Dahm Yu, Asan-si (KR); Jae Hyun Kim, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 262 days.

(21) Appl. No.: 17/406,553

(22) Filed: Aug. 19, 2021

(65) Prior Publication Data

US 2022/0057444 A1 Feb. 24, 2022

(30) Foreign Application Priority Data

Aug. 20, 2020 (KR) .................. 10-2020-0104560

(51) Int. Cl.
*G01R 31/27* (2006.01)
*G01R 31/28* (2006.01)
*G01R 31/3183* (2006.01)

(52) U.S. Cl.
CPC ....... *G01R 31/275* (2013.01); *G01R 31/2862* (2013.01); *G01R 31/2872* (2013.01); *G01R 31/2889* (2013.01); *G01R 31/318314* (2013.01)

(58) Field of Classification Search
None
See application file for complete search history.

(56) References Cited

U.S. PATENT DOCUMENTS

| | | | |
|---|---|---|---|
| 6,552,560 B2 | 4/2003 | Melgaard et al. | |
| 7,461,535 B2* | 12/2008 | Huang | G01P 21/00 |
| | | | 374/2 |
| 8,149,005 B2* | 4/2012 | Matsumoto | H01L 21/67259 |
| | | | 324/750.16 |
| 10,330,722 B2* | 6/2019 | Kim | G01R 31/2601 |
| 11,193,970 B2* | 12/2021 | Lee | G01R 31/2642 |
| 2004/0232933 A1* | 11/2004 | Maesaki | G01R 31/2862 |
| | | | 324/750.07 |
| 2007/0107500 A1* | 5/2007 | Patel | G01N 27/223 |
| | | | 73/335.04 |

(Continued)

FOREIGN PATENT DOCUMENTS

| | | | | |
|---|---|---|---|---|
| CN | 112798930 A | * | 5/2021 | |
| JP | 2003234282 A | * | 8/2003 | G03F 7/70808 |

(Continued)

OTHER PUBLICATIONS

Translation of JP-2008145047-A (Year: 2008).*
English translation of JP 2003234282 A (Year: 2003).*
English translation of CN 112798930 A (Year: 2021).*

*Primary Examiner* — Jermele M Hollington
(74) *Attorney, Agent, or Firm* — Harness, Dickey & Pierce, P.L.C.

(57) ABSTRACT

A semiconductor package test apparatus is provided. A semiconductor package test apparatus comprises a test board including a plurality of sensors, a chamber into which the test board is loaded, and a controller configured to control a temperature of the chamber, wherein the controller adjusts the temperature using the plurality of sensors.

13 Claims, 10 Drawing Sheets

(56) References Cited

U.S. PATENT DOCUMENTS

2014/0239484 A1* 8/2014 Matsuda ............. H01L 21/4871
219/400
2015/0316498 A1* 11/2015 Cummins ........... H01L 27/0629
324/689
2022/0178815 A1* 6/2022 Yu ...................... G01R 31/2862

FOREIGN PATENT DOCUMENTS

| JP | 2008145047 A | * | 6/2008 |
| JP | 5961286 B2 | | 8/2016 |
| KR | 10-0838695 B1 | | 6/2008 |
| KR | 10-1261759 B1 | | 3/2013 |
| KR | 10-2019-0010398 A | | 1/2019 |
| KR | 10-2020-0055479 A | | 5/2020 |

* cited by examiner

SEMICONDUCTOR PACKAGE TEST APPARATUS AND METHOD

CROSS-REFERENCE TO RELATED APPLICATION

This application claims priority from Korean Patent Application No. 10-2020-0104560 filed on Aug. 20, 2020 in the Korean Intellectual Property Office, and all the benefits accruing therefrom under 35 U.S.C. 119, the contents of which in its entirety are herein incorporated by reference.

BACKGROUND

Some example embodiments relate to a semiconductor package test apparatus and/or method.

In general, semiconductor devices may be formed on a substrate such as a silicon wafer used as a semiconductor substrate by repeatedly executing a series of fabrication processes, and manufactured into semiconductor packages through a dicing process, a bonding process, and a packaging process.

The semiconductor packages manufactured as described above may be determined as defective products or non-defective products by an electrical performance test. The test process may be performed by a test robot/controller/handler for handling the semiconductor packages and a tester such as an automated test equipment (ATE) for providing test signals for testing the semiconductor packages.

The semiconductor package test process may be performed after the semiconductor packages are accommodated in insert assemblies attached to a test board and the external connection terminals of the semiconductor packages accommodated in the insert assemblies are connected to the tester. An interface board for connecting the semiconductor packages to the tester may be attached to a sidewall of a test chamber for executing the semiconductor package test process, and socket boards for connection with the semiconductor packages may be disposed on the interface board. Further, the interface board may be connected to the tester for providing test signals to the semiconductor packages.

In addition, the inside of the test chamber may be heated and/or cooled for a high-temperature test process and/or a low-temperature test process. For example, hot air for heating the semiconductor packages or cold air for cooling the semiconductor packages may be supplied into the test chamber. Accordingly, the semiconductor packages may be heated to about 125° C. or cooled to about −60° C. in some example embodiments. The temperature in the test chamber may be maintained at a preset temperature based on the temperature values measured by a plurality of temperature sensors disposed in the test chamber. However, the measured temperature values may be different from the actual temperatures of the semiconductor packages during the execution of the test process. Further improved apparatuses and/or method are being investigated.

SUMMARY

According to some example embodiments of inventive concepts, there is provided a semiconductor package test apparatus including a test board including a plurality of sensors, a chamber into which the test board is configured to be loaded, and a controller configured to control a temperature of the chamber. The controller is configured to adjust the temperature based on output from the plurality of sensors.

According to some example embodiments of inventive concepts, there is provided a semiconductor package test apparatus including a tester configured to perform a test on a semiconductor package, a test board on which the semiconductor package is configured to be mounted, the test board including a plurality of sensors, a chamber into which the test board is configured to be loaded, and a controller configured to control a temperature of the chamber. The controller is configured to adjust the temperature based on output from the plurality of sensors.

According to some example embodiments of inventive concepts, there is provided a semiconductor package test apparatus including a plurality of sensors configured to sense temperature information of a semiconductor package, a test board on which the semiconductor package is configured to be mounted, a chamber into which the test board is configured to be loaded, and a controller configured to receive the temperature information sensed by the plurality of sensors. The controller is configured to adjust a temperature of the chamber based on the temperature information.

According to some example embodiments of inventive concepts, there is provided a semiconductor package test method including mounting a semiconductor package on a test board, loading the test board into a chamber, sensing temperature information of the semiconductor package based on output from a plurality of sensors on the test board, and adjusting, by a controller, a temperature of the chamber based on the temperature information.

BRIEF DESCRIPTION OF THE DRAWINGS

The above and other aspects and features inventive concepts will become more apparent by describing in detail example embodiments thereof with reference to the attached drawings, in which.

DETAILED DESCRIPTION OF SOME EXAMPLE EMBODIMENTS

Figure 1:
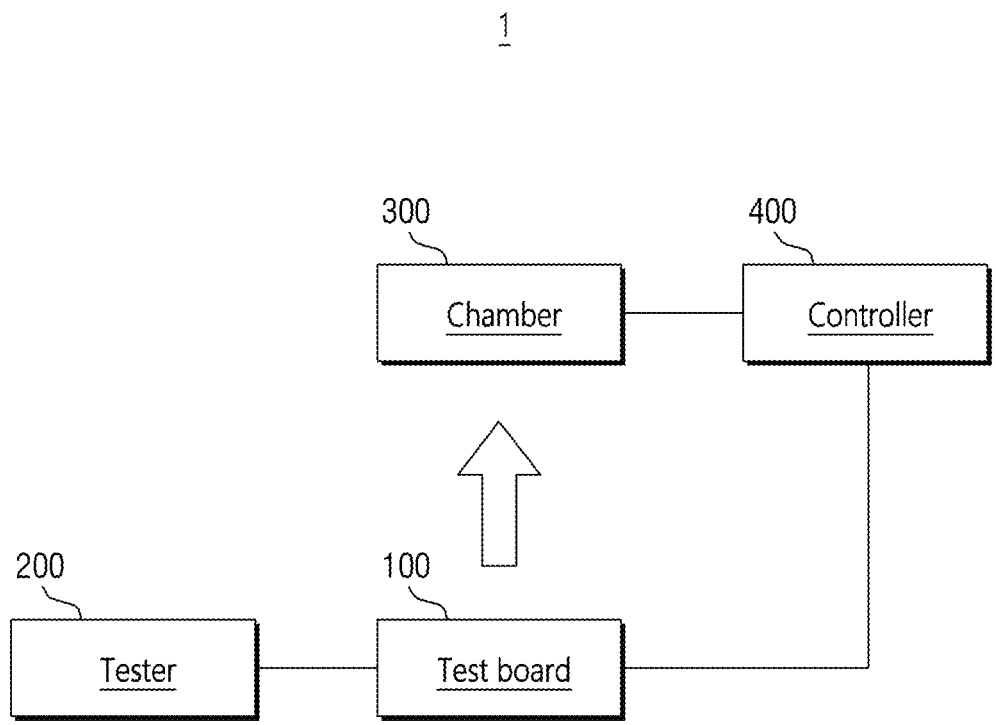
FIG. 1 is an example block diagram illustrating a semiconductor package test apparatus according to some example embodiments.

FIG. 1 is an example block diagram illustrating a semiconductor package test apparatus according to some example embodiments.

Referring to FIG. 1, a semiconductor package test apparatus 1 according to some example embodiments includes a test board 100, a tester 200, a chamber 300, and a controller 400.

In the semiconductor package test apparatus 1 according to some example embodiments, semiconductor packages to be tested may be mounted on the test board 100 and may be transferred to the chamber 300. The semiconductor packages mounted on the test board 100 are loaded into the chamber 300 and are electrically tested by the semiconductor package test apparatus 1 according to some example embodiments.

At this time, the temperature in the chamber 300 may be adjusted, e.g. may be pre-adjusted, to a test temperature in order to test the semiconductor packages mounted on the test board 100. After the electrical test of the semiconductor packages mounted on the test board 100 loaded into the chamber 300 is completed, the temperature in the chamber 300 may be recovered to another temperature, such as room temperature in order to recover the temperatures of the semiconductor packages to the room temperature. As used herein, room temperature may be 25° C. An operation of adjusting the temperature in the chamber 300 will be described in detail with reference to FIG. 2.

Figure 2:
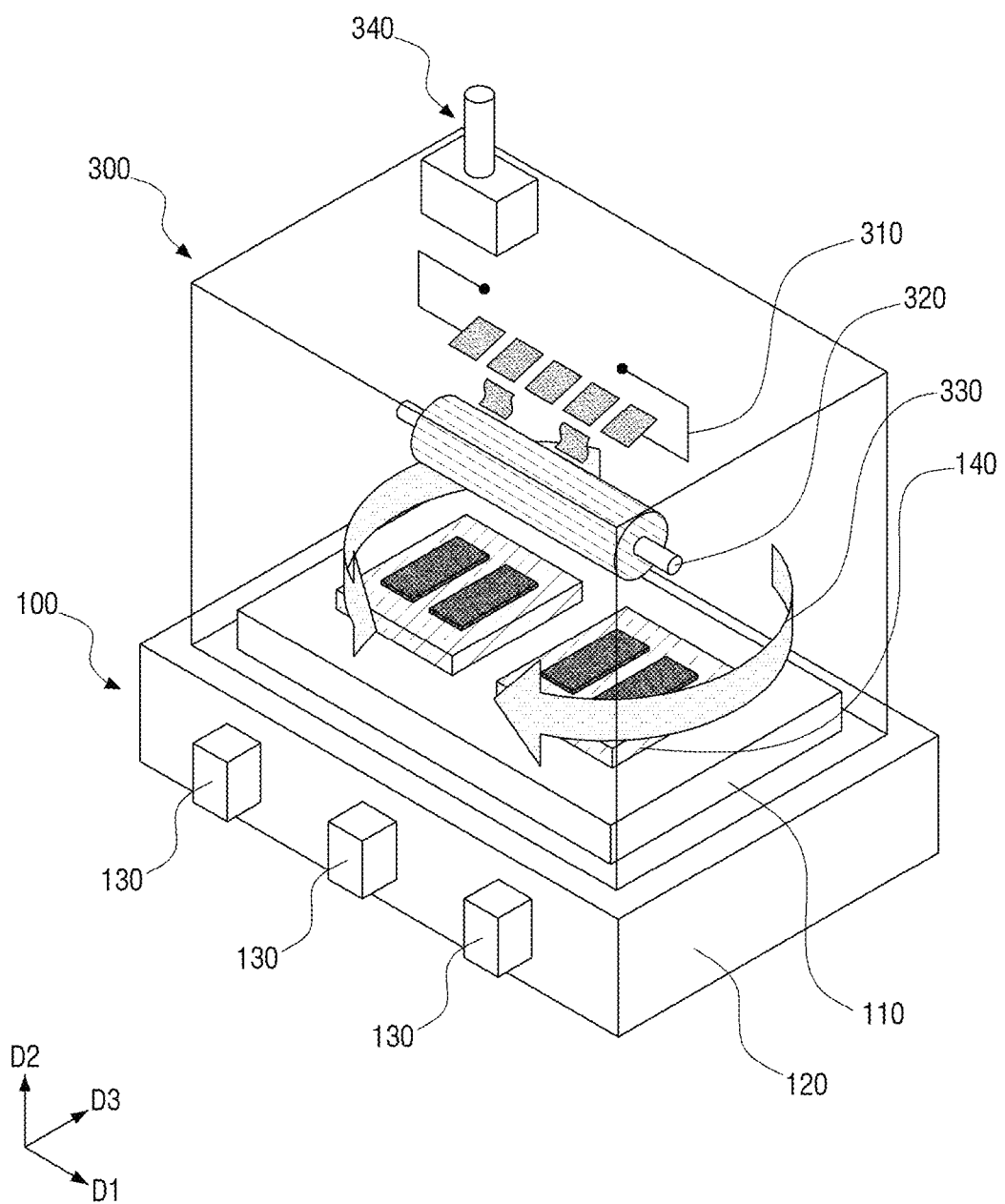
FIG. 2 is an example perspective view illustrating a test board and a chamber of a semiconductor package test apparatus according to some example embodiments.

FIG. 2 is an example perspective view illustrating a test board and a chamber of a semiconductor package test apparatus according to some example embodiments.

Referring to FIGS. 1 and 2, the test board 100 may be loaded into the chamber 300.

The test board 100 may include an upper board 110 and a lower board 120. The shape and/or the number of boards included in the test board 100 are not limited to those illustrated in FIG. 2. For example, the test board 100 may further include an intermediate board in addition to the upper board 110 and the lower board 120. Further, the boards do not necessarily have a rectangular shape. A plurality of packages 140 may be mounted on the upper board 110. The plurality of packages 140 mounted on the upper board 110 may be loaded into the chamber 300 and may be electrically tested by the semiconductor package test apparatus 1 according to some example embodiments. The structure of the test board 100 will be described in detail with reference to FIGS. 3 and 4.

Figure 3:
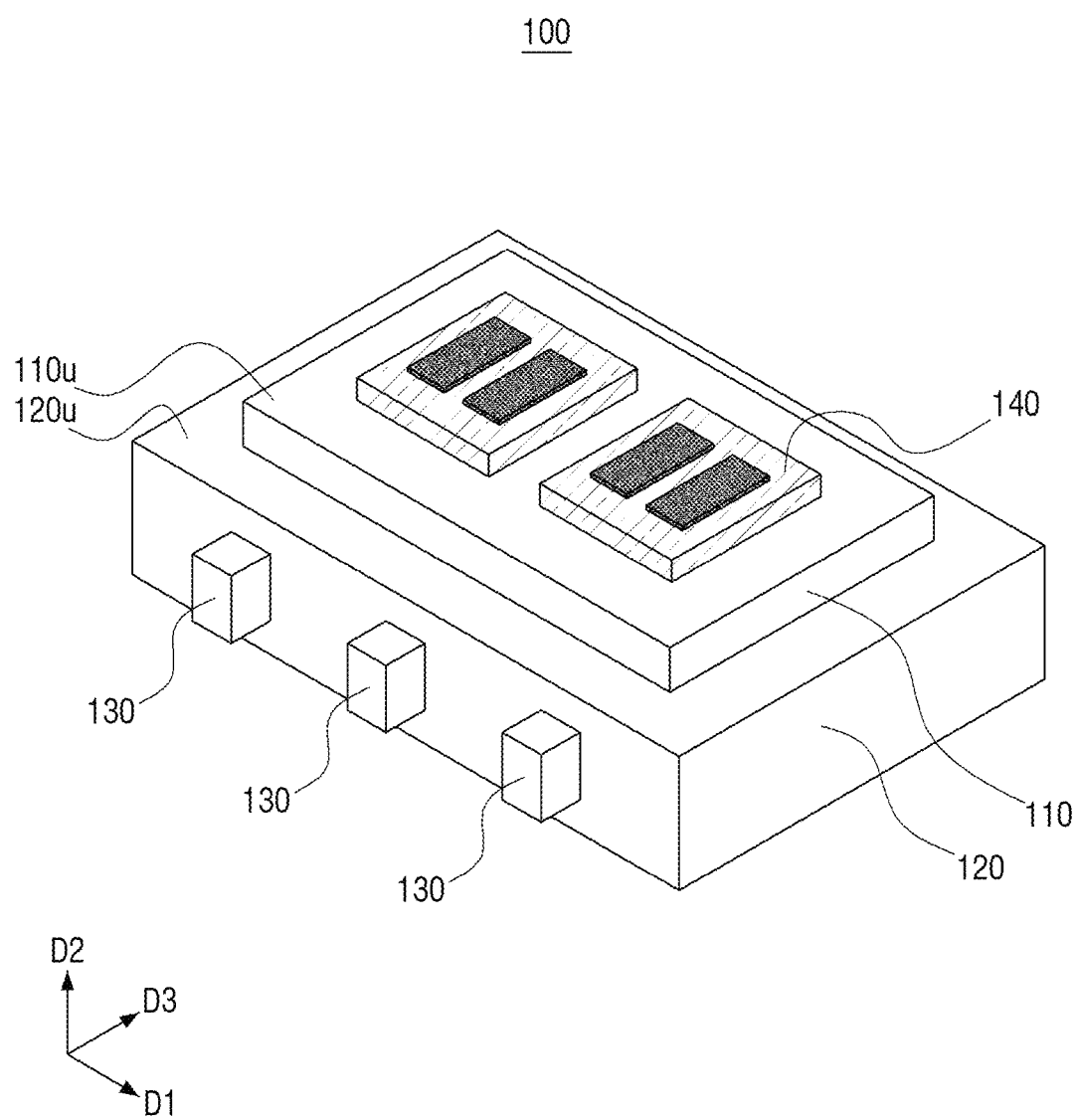
FIG. 3 is an example perspective view illustrating a test board of a semiconductor package test apparatus according to some example embodiments.
Figure 4:
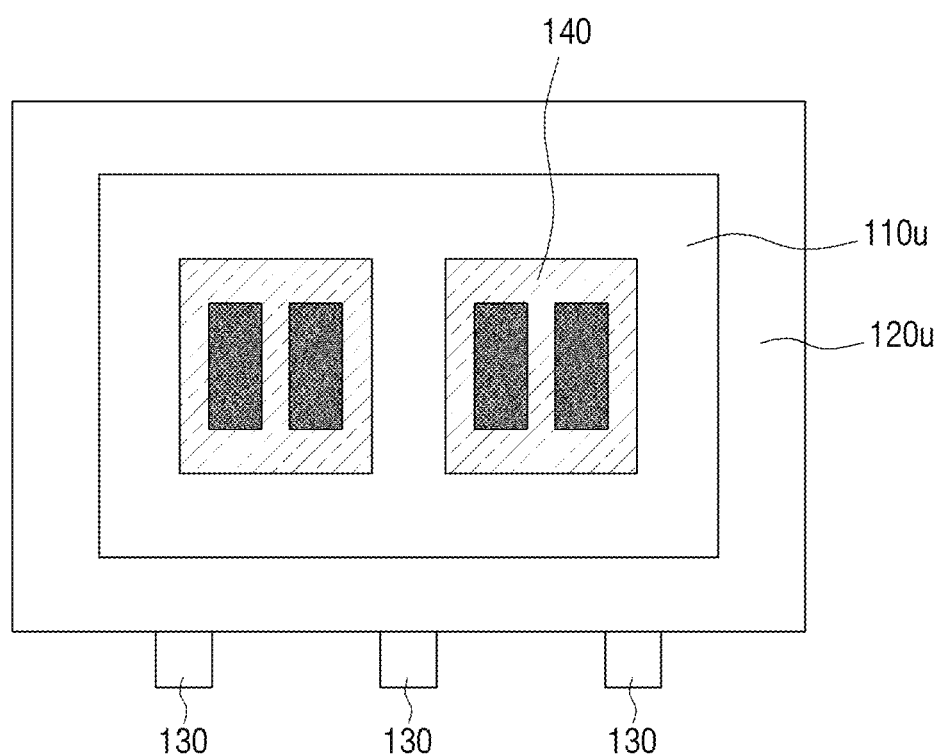
FIG. 4 is an example top view illustrating a test board of a semiconductor package test apparatus according to some example embodiments.

FIG. 3 is an example perspective view illustrating a test board of a semiconductor package test apparatus according to some example embodiments. FIG. 4 is an example top view illustrating a test board of a semiconductor package test apparatus according to some example embodiments.

Referring to FIGS. 1 to 4, the lower board 120 of the test board 100 may control the semiconductor package test process of the semiconductor package test apparatus 1 according to some example embodiments. For example, the lower board 120 may generate electrical signals for testing the semiconductor packages.

The upper board 110 may be disposed on a top surface 120u of the lower board 120. The upper board 110 may include a plurality of adapter boards. The upper board 110 may include, e.g., a connector for electrically connecting the semiconductor packages 140 to the lower board 120. For example, the upper board 110 may serve as an interface between the semiconductor package test apparatus 1 according to some example embodiments and the semiconductor packages 140.

The semiconductor packages 140 may be mounted on a top surface 110u of the upper board 110. The type of arrangement in which the semiconductor packages 140 are mounted on the top surface 110u of the upper board 110 is not limited to that shown in the drawings.

A plurality of sensors 130 may be disposed at the lower board 120 of the test board 100 of the semiconductor package test apparatus 1 according to some example embodiments. The plurality of sensors 130 may include only temperature sensors such as thermocouples. Alternatively, the plurality of sensors 130 may include only humidity sensors. Alternatively, the plurality of sensors 130 may include both the temperature sensors and the humidity sensors. In other words, the accuracy of measurement of the actual temperatures of the semiconductor packages 140 can be improved by measuring temperatures and/or humidities at positions closest to the semiconductor packages 140 using the plurality of sensors 130 disposed at the test board 100. Alternatively or additionally, the plurality of sensors 130 may include pressure sensors capable of determining a pressure within the chamber 300. Sensors such as the sensors 130 may be or include thermocouples and/or smart sensors and/or microelectromechanical system (MEMS) sensors; however, example embodiments are not limited thereto. Sensors such as the plurality of sensors 130 may be adjacent to, e.g. attached to, a wall and/or a side of the test board 100.

Any of the shape, the number, and the arrangement of the plurality of sensors 130 disposed at the test board 100 of the semiconductor package test apparatus 1 according to some example embodiments are not limited to those shown in the drawings.

Referring back to FIGS. 1 and 2, the chamber 300 may include a heater 310, a fan 320, and a cooling gas supply device 340. The arrangement and/or the shape of the heater 310, the fan 320, and the cooling gas supply device 340 are not limited to those shown in the drawings.

The temperature in the chamber 300 may be adjusted by at least one of the heater 310, the fan 320, and the cooling gas supply device 340. For example, a target test temperature may be applied to the semiconductor package 140 by heating air, such as clean, dry air and/or air supplied from the outside, in the chamber 300 using the heater 310 and circulating the heated internal air using the fan 320 as indicated by arrows 330. Alternatively or additionally, for example, the target test temperature may be applied to the semiconductor package 140 by supplying a cooling gas into the chamber 300 using the cooling gas supply device 340, cooling air in the chamber 300, and circulating the cooled internal air using the fan 320. The cooling gas may be, consist of, or include, e.g., liquid nitrogen (LN2), but example embodiments are not limited thereto.

At this time, in order to accurately apply a target test temperature to the semiconductor package 140, accurately detecting the temperature of the semiconductor package 140 in the chamber 300 may be necessary or desired. Therefore, the temperature in the chamber 300 may be adjusted by accurately measuring the temperature of the semiconductor package 140 using the plurality of sensors 130 disposed at the test board 100.

Next, referring to FIGS. 1 and 2, the temperature in the chamber 300 may be adjusted by the controller 400. The controller 400 may be configured as, for example, a single semiconductor chip such as a field programmable gate array (FPGA), an application specific integrated circuit (ASIC), and an application processor (AP). In some example embodiments, the controller 400 may be configured using an FPGA made by Xilinx, Altera, Lattice Semiconductor, Microsemi, Achronix, QuickLogic, e2v, or Atmel. In some example embodiments, the controller 400 may be a smart controller, and/or may be or include an application-specific integrated circuit (ASIC). The controller 400 may be or include an industrial controller, such as a programmable logic controller (PLC); however, example embodiments are not limited thereto. Alternatively or additionally, the controller 400 may be configured to execute machine-readable instructions to receive environmental information from sensors such as the plurality of sensors 130, to perform calculations based on the received environmental information, and to send signals, such as control signals, to other components such as at least one of the heater 310, the fan 330, or the gas supply 340 based on the results of the calculations. The controller 400 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. However, the configuration type of the controller 400 is not limited thereto.

The controller 400 may be wirelessly and/or wiredly connected to the chamber 300 to control the temperature in the chamber 300.

Additionally or alternatively, the controller 400 may be wirelessly and/or wiredly connected to the test board 100 to receive the temperature information of the semiconductor packages 140 sensed by the plurality of sensors 130 disposed at the test board 100. The controller 400 may adjust the temperature of the chamber 300 based on the temperature information sensed by the plurality of sensors 130 disposed at the test board 100.

For example, when the plurality of sensors 130 include temperature sensors, the temperature information sensed by the plurality of sensors 130 may be or correspond to the temperatures of the semiconductor packages 140. At this time, the controller 400 may adjust the temperature in the chamber 300 based on the temperatures sensed by the plurality of sensors 130. More specifically, when the controller 400 compares the temperatures sensed by the plurality of sensors 130 with a reference temperature and determines that the difference between the sensed temperatures and the reference temperature is smaller than a threshold temperature difference, e.g. an acceptable temperature difference, the temperature in the chamber 300 may be maintained. Alternatively, when the controller 400 compares the temperatures sensed by the plurality of sensors 130 with the reference temperature and determines that the difference between the sensed temperatures and the reference temperature is greater than the threshold temperature difference, e.g. the acceptable temperature difference, the temperature in the chamber 300 may be adjusted. The controller 400 may control at least one of the heater 310, the fan 320, or the gas supply 340 to adjust the temperature in the chamber 300. The reference temperature may be or correspond to a reference chamber temperature, and may be variably determined, or, alternatively, predetermined; however example embodiments are not limited thereto. The threshold temperature difference may be variably determined, or alternatively, may be predetermined.

Alternatively or additionally when the plurality of sensors 130 include humidity sensors, the temperature information sensed by the plurality of sensors 130 may be or correspond to the humidity information of the semiconductor packages 140. For example, when the plurality of sensors 130 include humidity sensors, the humidity information sensed by the plurality of sensors 130 may be the humidity in the chamber 300. At this time, the controller 400 may adjust the temperature in the chamber 300 based on the humidities sensed by the plurality of sensors 130. More specifically, when the controller 400 compares the humidities sensed by the plurality of sensors 130 with a reference humidity and determines that the difference between the sensed humidities and the reference humidity is smaller than a threshold humidity difference, e.g. an acceptable humidity difference, the temperature in the chamber 300 may be maintained. Alternatively, when the controller 400 compares the humidities sensed by the plurality of sensors 130 with the reference humidity and determines that the difference between the sensed humidities and the reference humidity is greater than the threshold humidity difference, e.g. the acceptable humidity difference, the temperature in the chamber 300 may be adjusted. The threshold humidity difference may be variably determined, or alternatively, may be predetermined. The controller 400 may control at least one of the heater 310, the fan 320, or the gas supply 340 to adjust the temperature in the chamber 300.

Alternatively or additionally, when the plurality of sensors 130 include the temperature sensors and the humidity sensors, the temperature information sensed by the plurality of sensors 130 may be the temperatures and the humidities of the semiconductor packages 140. At this time, the controller 400 may adjust the temperature in the chamber 300 based on the temperatures and the humidities sensed by the plurality of sensors 130. More specifically, the controller 400 may calculate a dew point in the chamber 300 based on the temperatures and the humidities sensed by the plurality of sensors 130 and adjust the temperature in the chamber 300 based on the calculated dew point. The controller 400 may control at least one of the heater 310, the fan 320, or the gas supply 340 to adjust the temperature in the chamber 300.

The following is a detailed description of the case where the plurality of sensors 130 according to some example embodiments include the temperature sensors and the humidity sensors.

The controller 400 may calculate a dew point Tdp based on the following example Eq. 1 using a temperature T and a humidity RH sensed by the plurality of sensors 130. The humidity RH may be an absolute humidity RH sensed by some of the plurality of sensors 130.

$$Tdp = \frac{c\gamma m(T, RH)}{b - \gamma m(T, RH)} \quad \text{Eq. 1}$$

In the above Eq. 1, γm(T,RH) may be calculated by the following Eq. 2.

$$\gamma m(T, RH) = \ln\left(\frac{RH}{100} e^{\left(b - \frac{T}{d}\right)\left(\frac{T}{c+T}\right)}\right) \quad \text{Eq. 2}$$

In the above Eq. 1 and Eq. 2, b may be 18.678, c may be 257.14° C., and d may be 234.5° C.

For example, the controller 400 may adjust the temperature in the chamber 300 based on the dew point Tdp calculated by the above Eq. 1 and Eq. 2 using the temperature T and the humidity RH sensed by the plurality of sensors 130. The equation used when the controller 400 calculates the dew point using the temperature T and the humidity RH sensed by the plurality of sensors 130 is not limited to the above-described Eq. 1 and Eq. 2.

For example, when the controller 400 compares the dew point calculated using the temperatures and the humidities sensed by the plurality of sensors 130 with a reference dew point and determines that the difference between the calculated dew point and the reference dew point is smaller than a threshold dew point difference, e.g. an acceptable dew point difference, the temperature in the chamber 300 may be maintained. Alternatively or additionally, when the controller 400 compares the dew point calculated using the temperatures and the humidities sensed by the plurality of sensors 130 with a reference dew point and determines that the difference between the calculated dew point and the reference dew point is greater than a threshold dew point difference, e.g. an acceptable dew point difference, the temperature in the chamber 300 may be adjusted. The threshold dew point difference may be determined variably, or alternatively, may be predetermined. The controller 400 may control at least one of the heater 310, the fan 320, or the gas supply 340 to adjust the temperature in the chamber 300.

The controller 400 may wirelessly adjust the temperature in the chamber 300 and/or wirelessly receive the temperature information from the test board 100 using a transmission antenna and a reception antenna disposed in the controller 400. Alternatively or additionally, the controller 400 may perform wireless communication through a transmission/reception antenna. The wireless communication of the controller 400 may be performed by, e.g., infrared data association (IrDA), radio frequency identification (RFID), Zigbee, Bluetooth, Wi-Fi, or ultra-wideband (UWB). However, the wireless communication of the controller 400 is not limited thereto.

The test board 100 may receive a signal from the tester 200 to electrically test the semiconductor package.

The tester 200 may be, include, or correspond to, e.g., a computer system. However, the tester 200 is not limited thereto, and may be any electronic device such as a portable computer, a personal mobile terminal (PDA), a mobile phone, a repeater, an access point (AP), a portable electronic device, or the like capable of transmitting and receiving data to and from an external device (e.g., the test board 100). When the tester 200 is a computer system, the tester 200 may transfer a control signal and data among a CPU, a RAM, and a wireless interface through an internal bus. In some example embodiments, a wireless interface may be a SATA interface (SATA I/F), or may include a wired standard interface device supporting ATA, SATA1, SATA2, and SAS protocols and a wireless interface device connected thereto. The tester 200 is not necessarily the above-described computer system, and may be any electronic device capable of wirelessly transmitting and receiving data to and from an external device (e.g., the test board 100).

Hereinafter, test boards of other semiconductor package test apparatuses according to some example embodiments will be described by way of example.

Figure 5:
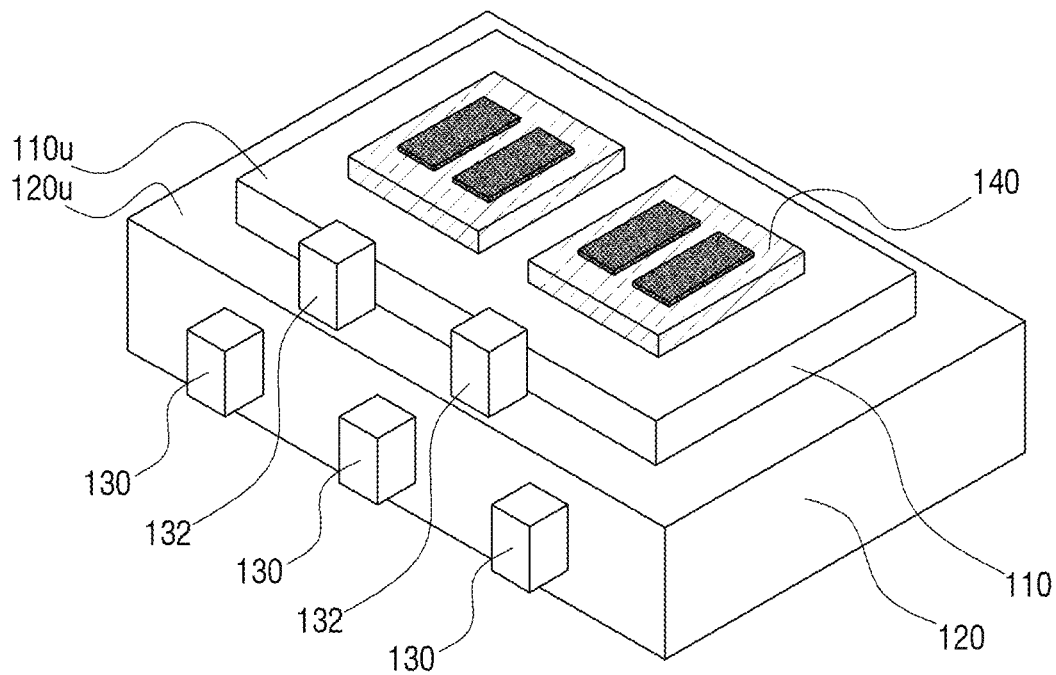
FIG. 5 is an example perspective view illustrating a test board of another semiconductor package test apparatus according to some example embodiments.
Figure 5:
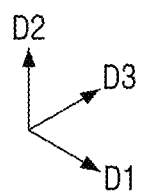
Figure 6:
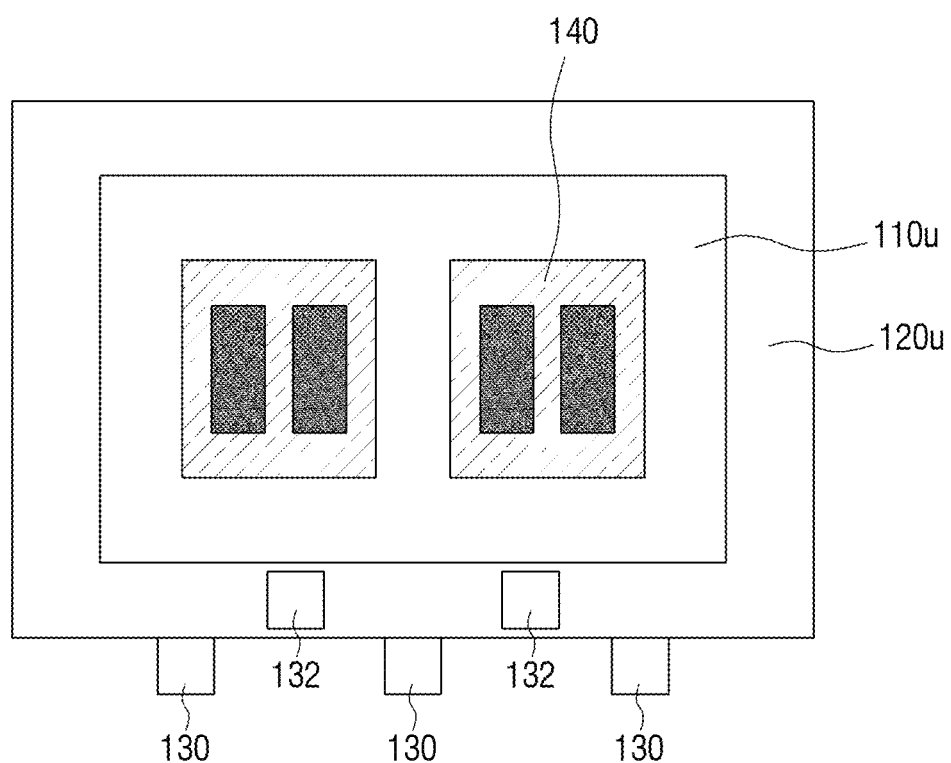
FIG. 6 is an example top view illustrating a test board of another semiconductor package test apparatus according to some example embodiments.
Figure 6:
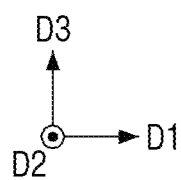

FIG. 5 is an example perspective view illustrating a test board of another semiconductor package test apparatus according to some example embodiments. FIG. 6 is an example top view illustrating a test board of another semiconductor package test apparatus according to some example embodiments.

Referring to FIGS. 5 and 6, unlike the test board 100 of FIG. 2, a test board 102 of another semiconductor package test apparatus according to some example embodiments may further include a plurality of sensors 132 disposed on the top surface 120u of the lower board 120.

For example, the test board 100 of FIG. 2 may include the plurality of sensors 130 arranged in a first direction D1 and/or a third direction D3 of the lower board 120, whereas the test board 102 of FIGS. 5 and 6 may further include the plurality of sensors 132 arranged in a second direction D2 of the lower board 120.

Therefore, the semiconductor package test apparatus including the test board 102 of FIGS. 5 and 6 according to some example embodiments can detect the temperature of the semiconductor package 140 more accurately.

Figure 7:
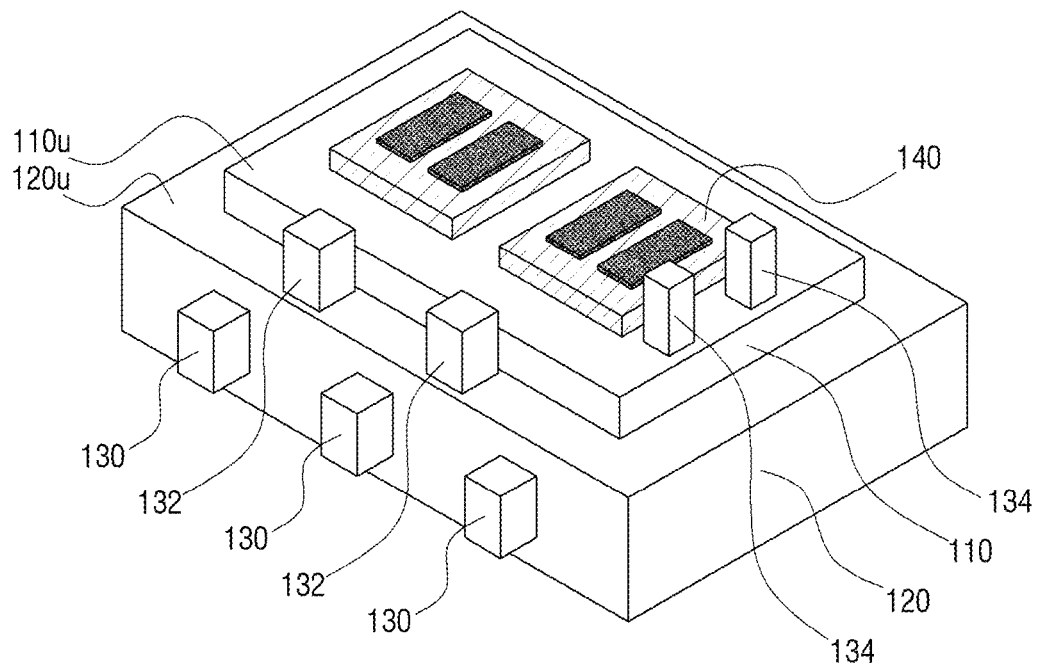
FIG. 7 is an example perspective view illustrating a test board of another semiconductor package test apparatus according to some example embodiments.
Figure 7:
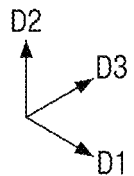
Figure 8:
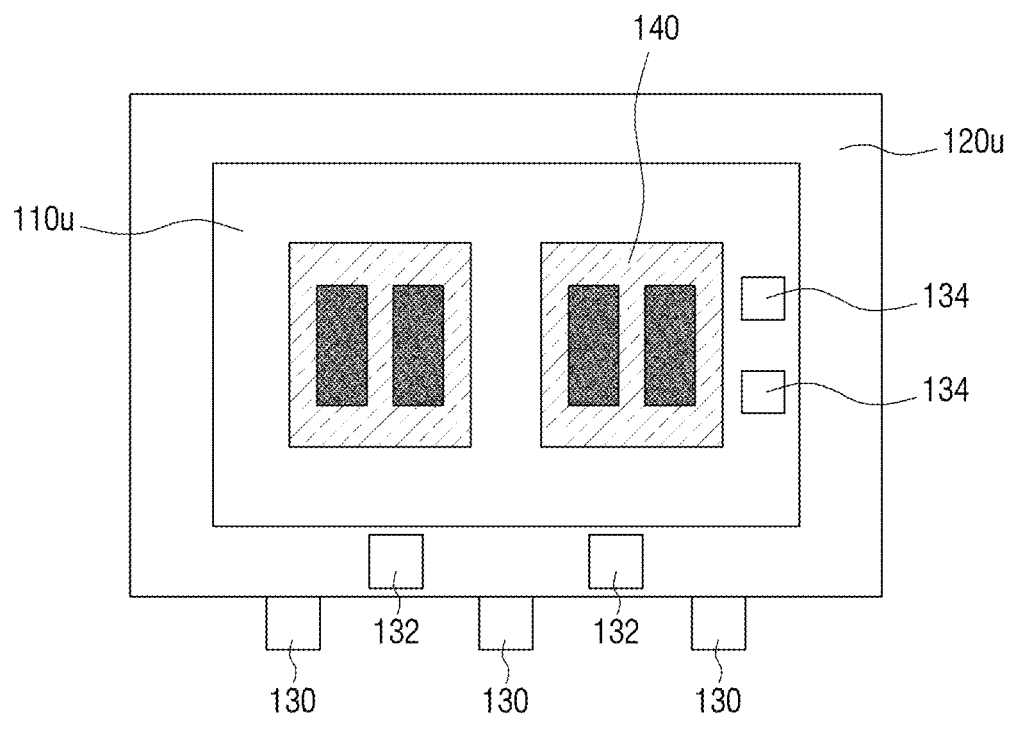
FIG. 8 is an example top view illustrating a test board of another semiconductor package test apparatus according to some example embodiments.
Figure 8:
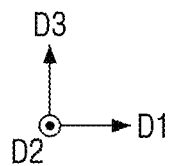

FIG. 7 is an example perspective view illustrating a test board of another semiconductor package test apparatus according to some example embodiments. FIG. 8 is an example top view illustrating a test board of another semiconductor package test apparatus according to some example embodiments.

Referring to FIGS. 7 and 8, unlike the test board 102 of FIGS. 5 and 6, a test board 104 of another semiconductor package test apparatus according to some example embodiments may further include a plurality of sensors 134 disposed on the top surface 110u of the upper board 110.

For example, the test board 102 of FIGS. 5 and 6 may include the plurality of sensors 130 arranged in the first direction D1 and/or the third direction D3 of the lower board 120 and the plurality of other sensors 132 arranged in the second direction D2 of the lower board 120, whereas the test board 104 of FIGS. 7 and 8 may further include the plurality of sensors 134 arranged in the second direction D2 of the upper board 110.

Therefore, the semiconductor package test apparatus including the test board 104 of FIGS. 7 and 8 according to some example embodiments can detect the temperature of the semiconductor package 140 more accurately.

Figure 9:
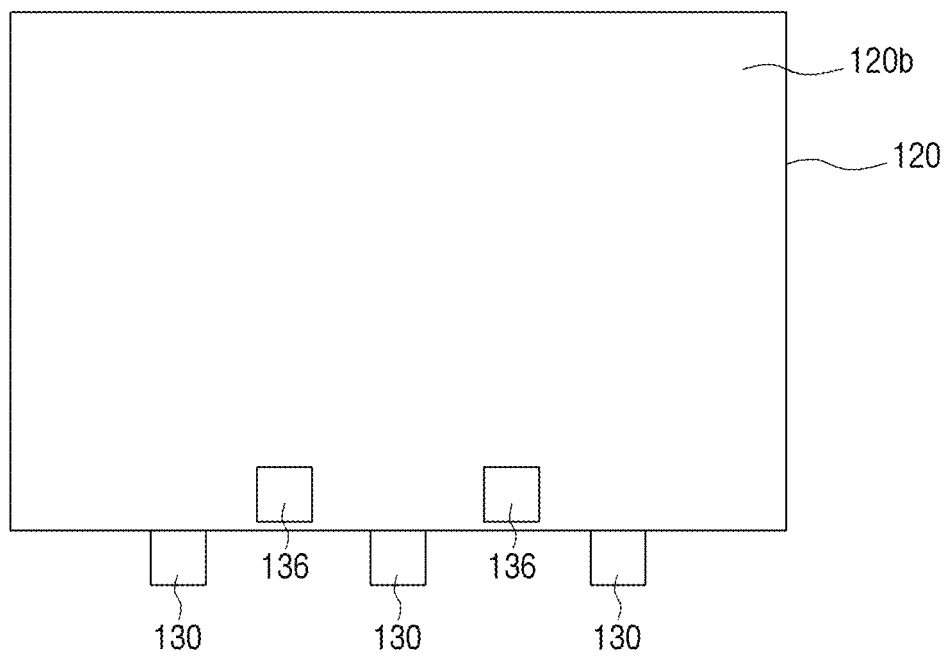
FIG. 9 is an example rear view illustrating a test board of another semiconductor package test apparatus according to some example embodiments.
Figure 9:
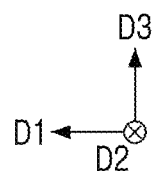

FIG. 9 is an example rear view illustrating a test board of another semiconductor package test apparatus according to some example embodiments.

Referring to FIG. 9, unlike the test board 104 of FIGS. 7 and 8, a test board 106 of another semiconductor package test device according to some example embodiments may further include a plurality of sensors 136 disposed on a bottom surface 120b of the lower board 120.

For example, the test board 104 of FIGS. 7 and 8 includes the plurality of sensors 130 arranged in the first direction D1 and/or the third direction D3 of the lower board 120, the plurality of other sensors 132 arranged in the second direction D2 of the lower board 120, and the plurality of other sensors 134 arranged in the second direction D2 of the upper board 110, whereas the test board 106 of FIG. 9 may further include the plurality of sensors 136 arranged on the bottom surface 120b of the lower board 120.

Therefore, the semiconductor package test apparatus including the test board 106 of FIG. 9 according to some example embodiments can detect the temperature of the semiconductor package 140 more accurately.

The arrangement and/or the number of the plurality of sensors are not limited to those shown in the drawings. The arrangement and/or the number of the plurality of sensors are not limited as long as they are disposed at the test board 100.

Figure 10:
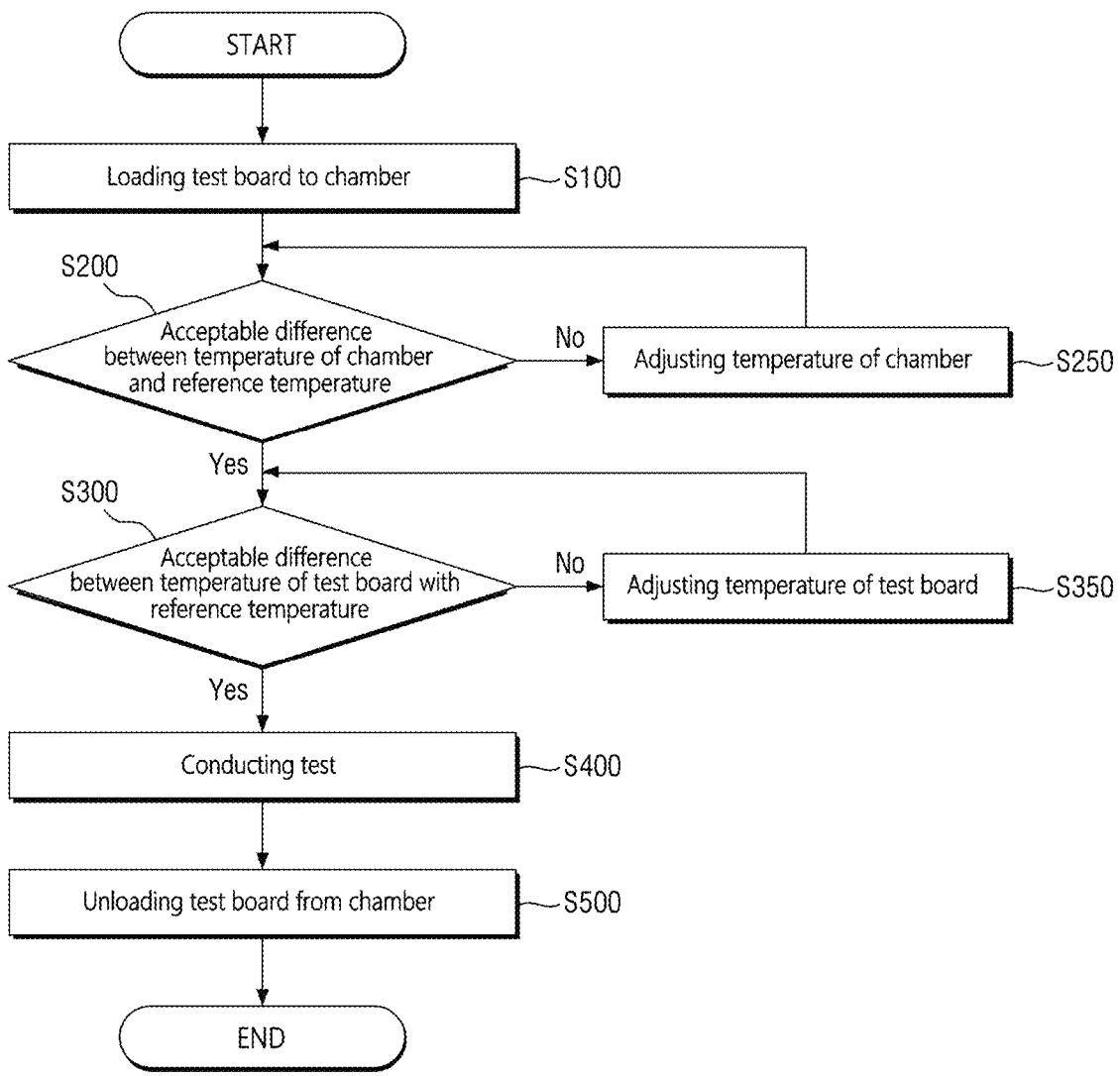
FIG. 10 is an example flowchart illustrating a semiconductor package test method according to some example embodiments.

FIG. 10 is an example flowchart illustrating a semiconductor package test method according to some example embodiments.

A semiconductor package test method of the semiconductor package test apparatus 1 shown in FIGS. 1 and 2 according to some example embodiments will be described with reference to FIGS. 1, 2, and 10. For reference, the semiconductor package test method of FIG. 10 according to some example embodiments may also be performed by the semiconductor package test apparatus according to some other embodiments described above.

First, the test board on which the semiconductor package 140 is mounted is loaded into the chamber 300 (step S100). Before, simultaneously, or after step S100, the controller 400 compares the temperature in the chamber 300 with the reference temperature to determine whether or not the difference between the temperature in the chamber 300 and the reference temperature is within a threshold or an acceptable range (step S200). The threshold or acceptable range may be variably determined, or alternatively, may be predetermined. The controller 400 may determine the temperature in the chamber based on a temperature sensor located on, or, alternatively, not located on the test board 100.

It is assumed that the controller 400 determines that the difference between the temperature in the chamber 300 and the reference temperature (e.g. the reference chamber temperature) is not within the threshold or acceptable range (No). The controller 400 adjusts the temperature in the chamber 300 (step S250). Then, for example at a later time, e.g. a time determined based on the difference between the temperature in the chamber 300 and the reference temperature, the controller 400 compares the temperature in the chamber 300 with the reference temperature again to determine whether or not the difference between the temperature in the chamber 300 and the reference temperature, e.g. the reference chamber temperature, is within the threshold or acceptable range (step S200).

When the controller 400 determines that the difference between the temperature in the chamber 300 and the reference temperature is within the threshold or acceptable range, the controller 400 receives the temperature information of the semiconductor package 140 from the plurality of sensors 130 disposed at the test board 100 and compares the received temperature information with the reference temperature information (step S300).

For example, when the plurality of sensors 130 include temperature sensors, the temperature information sensed by the plurality of sensors 130 may be or correspond to the temperatures of the semiconductor packages 140. At this time, the controller 400 may adjust the temperature in the chamber 300 based on the temperatures sensed by the plurality of sensors 130. More specifically, when the controller 400 compares the temperatures sensed by the plurality of sensors 130 with the reference temperature and determines that the difference between the sensed temperatures and the reference temperature is less than the threshold temperature difference, e.g. the acceptable temperature difference (Yes), the temperature in the chamber 300 and/or the temperature of the test board 100 are maintained and, then, the test may be conducted (step S400). Alternatively, when the controller 400 compares the temperatures sensed by the plurality of sensors 130 with the reference temperature and determines that the difference between the sensed temperatures and the reference temperature is greater than the threshold temperature difference, e.g. the acceptable temperature difference (No), the temperature in the chamber 300 and/or the temperature of the test board 100 may be adjusted (step S350). The controller 400 may control at least one of the heater 310, the fan 320, or the gas supply 340 to adjust the temperature in the chamber 300 and/or the temperature of the test board 100. The reference temperature used in the comparison of the test board 100 may be the same as, or different from, the reference temperature used in the comparison of the chamber 300.

Alternatively or additionally, when the plurality of sensors 130 include humidity sensors, the temperature information sensed by the plurality of sensors 130 may be or correspond to the humidities of the semiconductor packages 140. At this time, the controller 400 may adjust the temperature in the chamber 300 based on the humidities sensed by the plurality of sensors 130. More specifically, when the controller 400 compares the humidities sensed by the plurality of sensors 130 with the reference humidity and determines that the difference between the sensed humidities and the reference humidity is smaller than the threshold humidity difference, e.g. the acceptable humidity difference (Yes), the temperature in the chamber 300 and/or the temperature of the test board 100 are maintained and, then, the test may be conducted (step S400). Alternatively, when the controller 400 compares the humidities sensed by the plurality of sensors 130 with the reference humidity and determines that the difference between the sensed humidities and the reference humidity is greater than the threshold humidity difference, e.g. the acceptable humidity difference (No), the temperature in the chamber 300 and/or the temperature of the test board 100 may be adjusted (step S350). The reference humidity may be variably determined, or, alternatively, may be predetermined.

When the plurality of sensors 130 includes the temperature sensors and the humidity sensors, the temperature information sensed by the plurality of sensors 130 may be the temperatures and the humidities of the semiconductor packages 140. At this time, the controller 400 may adjust the temperature in the chamber 300 based on the temperatures and the humidities sensed by the plurality of sensors 130. More specifically, the controller 400 may calculate a dew point in the chamber 300 based on the temperatures and the humidities sensed by the plurality of sensors 130 and adjust the temperature in the chamber 300 based on the calculated dew point. The controller 400 may control at least one of the heater 310, the fan 320, or the gas supply 340 to adjust the temperature in the chamber 300. Then, when the controller 400 compares the dew point calculated using the temperatures and the humidities sensed by the plurality of sensors 130 with the reference dew point and determines that the difference between the calculated dew point and the reference dew point is smaller than the threshold dew point difference, e.g. the acceptable dew point difference (Yes), the temperature in the chamber 300 and/or the temperature of the test board 100 are maintained and, then, the test may be conducted (step S400). Alternatively, when the controller 400 compares the dew point calculated using the temperatures and the humidities sensed by the plurality of sensors 130 with the reference dew point and determines that the difference between the calculated dew point and the reference dew point is greater than the threshold dew point difference, e.g. acceptable dew point difference (No), the temperature in the chamber 300 and/or the temperature of the test board 100 may be adjusted (step S350).

When the test board 100 on which the tested semiconductor package 140 is mounted is unloaded from the chamber 300, the test may be completed.

Those of ordinary skill in the art will appreciate that many variations and/or modifications can be made to example embodiments without substantially departing from the principles of inventive concepts. Therefore, example embodiments of inventive concepts are used in a generic and descriptive sense only and not for purposes of limitation.

What is claimed is:

1. A semiconductor package test apparatus comprising:
a test board including a plurality of sensors;
a chamber into which the test board is configured to be loaded; and
a controller configured to control a temperature of the chamber,
wherein the controller is configured to adjust the temperature based on output from the plurality of sensors,
wherein the plurality of sensors include a temperature sensor and a humidity sensor, and
wherein the controller is configured to calculate a dew point of the test board using a temperature of the test board and a humidity of the test board, the temperature of the test board measured by the temperature sensor and the humidity of the test board measured by the humidity sensor.

2. The semiconductor package test apparatus of claim 1, wherein the controller is configured to compare the dew point with a reference dew point, and
in response to a difference between the dew point and the reference dew point being greater than a threshold dew point difference, the controller is configured to adjust the temperature.

3. The semiconductor package test apparatus of claim 1, wherein the controller is configured to compare the temperature of the chamber with a reference temperature, and
in response to a difference between the temperature of the chamber and the reference temperature being greater than a threshold temperature difference, the controller is configured to adjust the temperature of the chamber.

4. The semiconductor package test apparatus of claim 1, wherein the plurality of sensors are on a side surface of the test board.

5. The semiconductor package test apparatus of claim 1, wherein the controller is configured to measure the temperature of the test board based on output from at least one of the plurality of sensors,
the controller is configured to compare the temperature of the test board with a reference board temperature, and
in response to a difference between the temperature of the test board and the reference board temperature being greater than a threshold board temperature difference, the controller is configured to adjust the temperature of the test board.

6. A semiconductor package test apparatus comprising:
a tester configured to perform a test on a semiconductor package;
a test board on which the semiconductor package is configured to be mounted, the test board including a plurality of sensors;
a chamber into which the test board is configured to be loaded; and
a controller configured to control a temperature of the chamber,
wherein the controller is configured to adjust the temperature based on output from the plurality of sensors,
wherein the plurality of sensors include a temperature sensor and a humidity sensor, and
wherein the controller is configured to calculate a dew point of the test board using a temperature of the test board and a humidity of the test board, the temperature of the test board measured by the temperature sensor and the humidity of the test board measured by the humidity sensor.

7. The semiconductor package test apparatus of claim 6, wherein the controller is configured to compare the dew point with a reference dew point, and
in response to a difference between the dew point and the reference dew point being greater than a threshold dew point difference, the controller is configured to adjust the temperature.

8. The semiconductor package test apparatus of claim 6, wherein the controller is configured to compare the temperature of the chamber with a reference temperature, and
in response to a difference between the temperature of the chamber and the reference temperature being greater than a threshold temperature difference, the controller is configured to adjust the temperature of the chamber.

9. The semiconductor package test apparatus of claim 6, wherein the plurality of sensors are on a side surface of the test board.

10. The semiconductor package test apparatus of claim 6, wherein the controller is configured to measure the temperature of the test board based on output from the plurality of sensors,
the controller is configured to compare the temperature of the test board with a reference board temperature, and
in response to a difference between the temperature of the test board and the reference board temperature being greater than a threshold board temperature difference, the controller is configured to adjust the temperature of the test board.

11. A semiconductor package test method comprising:
mounting a semiconductor package on a test board;
loading the test board into a chamber;
sensing temperature information of the semiconductor package based on output from a plurality of sensors on the test board, wherein the plurality of sensors include a temperature sensor and a humidity sensor and the sensing of the temperature information includes measuring a humidity of the semiconductor package;
calculating a dew point of the semiconductor package using the temperature information and the humidity; and
adjusting, by a controller, a temperature of the chamber based on the temperature information.

12. The semiconductor package test method of claim 11, further comprising:
comparing, by the controller, the dew point with a reference dew point; and
in response to a difference between the dew point and the reference dew point being greater than a threshold dew point difference, adjusting, by the controller, the temperature of the chamber.

13. The semiconductor package test method of claim 11, wherein the adjusting of the temperature by the controller comprises,
comparing the temperature with a reference temperature, and
in response to a difference between the temperature and the reference temperature being greater than a threshold temperature difference, adjusting the temperature of the chamber.

* * * * *